(12) United States Patent
Su

(10) Patent No.: US 11,521,926 B2
(45) Date of Patent: Dec. 6, 2022

(54) SEMICONDUCTOR DEVICE STRUCTURE WITH SERPENTINE CONDUCTIVE FEATURE AND METHOD FOR FORMING THE SAME

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 80 days.

(21) Appl. No.: 17/197,770

(22) Filed: Mar. 10, 2021

(65) Prior Publication Data

US 2022/0293519 A1 Sep. 15, 2022

(51) Int. Cl.
| | |
|---|---|
| H01L 23/528 | (2006.01) |
| H01L 23/522 | (2006.01) |
| H01L 21/027 | (2006.01) |
| H01L 21/033 | (2006.01) |
| H01L 21/768 | (2006.01) |

(52) U.S. Cl.
CPC ...... *H01L 23/5283* (2013.01); *H01L 21/0276* (2013.01); *H01L 21/0332* (2013.01); *H01L 21/0337* (2013.01); *H01L 21/76879* (2013.01); *H01L 23/5226* (2013.01)

(58) Field of Classification Search
CPC ............ H01L 23/5283; H01L 21/0276; H01L 21/0332; H01L 21/0337; H01L 21/76879; H01L 23/5226

USPC .......................................................... 257/773
See application file for complete search history.

(56) References Cited

U.S. PATENT DOCUMENTS

| | | | |
|---|---|---|---|
| 2007/0215940 A1* | 9/2007 | Ligon | ................. H01L 29/7881 257/341 |
| 2017/0062216 A1 | 3/2017 | Chen et al. | |
| 2019/0103281 A1* | 4/2019 | Chen | ................. H01J 37/32366 |

FOREIGN PATENT DOCUMENTS

| | | |
|---|---|---|
| TW | 201011863 A | 3/2010 |
| TW | 201913762 A | 4/2019 |

* cited by examiner

*Primary Examiner* — Caleen O Sullivan
(74) *Attorney, Agent, or Firm* — Muncy, Geissler, Olds & Lowe, P.C.

(57) ABSTRACT

The present disclosure relates to a semiconductor device structure with a serpentine conductive feature and a method for forming the semiconductor device structure. The semiconductor device structure includes a conductive pad disposed in a semiconductor substrate, and a first mask layer disposed over the semiconductor substrate. The semiconductor device structure also includes a second mask layer disposed over the first mask layer. The first mask layer and the second mask layer are made of different materials. The semiconductor device structure further includes a conductive feature penetrating through the first mask layer and the second mask layer to connect to the conductive pad. The conductive feature has a serpentine pattern in a top view.

20 Claims, 20 Drawing Sheets

SEMICONDUCTOR DEVICE STRUCTURE WITH SERPENTINE CONDUCTIVE FEATURE AND METHOD FOR FORMING THE SAME

TECHNICAL FIELD

The present disclosure relates to a semiconductor device structure and a method for forming the same, and more particularly, to a semiconductor device structure with a serpentine conductive feature and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a conductive pad disposed in a semiconductor substrate, and a first mask layer disposed over the semiconductor substrate. The semiconductor device structure also includes a second mask layer disposed over the first mask layer. The first mask layer and the second mask layer are made of different materials. The semiconductor device structure further includes a conductive feature penetrating through the first mask layer and the second mask layer to connect to the conductive pad. The conductive feature has a serpentine pattern in a top view.

In an embodiment, the second mask layer includes a diamond-like carbon material having sp3 bonding. In an embodiment, the second mask layer is doped with carbon. In an embodiment, the conductive feature further includes a conductive layer, and a barrier layer separating the conductive layer from the conductive pad, the first mask layer, the second mask layer.

In an embodiment, the serpentine pattern of the conductive feature includes a first line segment and a second line segment extending along a first direction in a top view, and a connecting segment extending along a second direction in the top view and physically connecting the first line segment and the second line segment, wherein the connecting segment has a width along the first direction, and a shortest distance between the first line segment and the second line segment is less than twice of the width of the connecting segment. In an embodiment, the first direction is perpendicular to the second direction, and an edge of the connecting segment is substantially aligned with an edge of the first line segment and an edge of the second line segment in the top view.

In another embodiment of the present disclosure, a semiconductor device structure is provided. The semiconductor device structure includes a conductive pad disposed in a semiconductor substrate, and a first mask layer disposed over the semiconductor substrate. The semiconductor device structure also includes a second mask layer disposed over the first mask layer, and a conductive feature disposed in the first mask layer and the second mask layer and electrically connected to the conductive pad. The conductive feature includes a connecting segment extending along a first direction, and a first line segment and a second line segment extending along a second direction. The first line segment and the second line segment are physically connected by the connecting segment, and an edge of the connecting segment is substantially aligned with an edge of the first line segment and an edge of the second line segment.

In an embodiment, the first direction is perpendicular to the second direction. In an embodiment, the first direction and the second direction are parallel to a top surface of the conductive feature. In an embodiment, the connecting segment has a width along the second direction, and a shortest distance between the first line segment and the second line segment is less than twice of the width of the connecting segment. In an embodiment, the first mask layer includes silicon nitride or silicon oxynitride, the second mask layer includes a diamond-like carbon material having sp3 bonding, and the second mask layer is doped with carbon.

In yet another embodiment of the present disclosure, a method for forming a semiconductor device structure is provided. The method includes forming a conductive pad in a semiconductor substrate, and forming a first mask layer over the semiconductor substrate and covering the conductive pad. The method also includes forming a second mask layer over the first mask layer, and performing an implantation process to introduce a doping species into the second mask layer. The method further includes forming an opening structure in the first mask layer and the second mask layer to expose the conductive pad after the implantation process is performed. The opening structure has a serpentine pattern in a top view. In addition, the method includes filling the opening structure with a conductive feature.

In an embodiment, the first mask layer and the second mask layer include different materials before the implantation process is performed. In an embodiment, the second mask layer includes a diamond-like carbon material having sp3 bonding before the implantation process is performed. In an embodiment, the doping species includes carbon. In an embodiment, filling the opening structure with the conductive feature includes depositing a barrier layer lining the opening structure and extending over the second mask layer, forming a conductive layer in a remaining portion of the opening structure and over the barrier layer, and performing a planarization process on the barrier layer and the conductive layer until the second mask layer is exposed.

In an embodiment, the serpentine pattern of the opening structure includes a first line segment and a second line segment extending parallel to each other, and a connecting segment physically connecting the first line segment and the second line segment, wherein an edge of the connecting segment is substantially aligned with an edge of the first line segment and an edge of the second line segment. In an embodiment, an extending direction of the connecting segment is perpendicular to an extending direction of the first line segment, and wherein the connecting segment has a width along the extending direction of the first line segment, and a shortest distance between the first line segment and the second line segment is less than twice of the width of the connecting segment. In an embodiment, the method further includes forming a dielectric anti-reflective coating (DARC) layer over the second mask layer, and forming a patterned mask over the DARC layer, wherein the opening structure is formed by performing an etching process using the patterned mask as a mask, and the patterned mask and the DARC layer are removed before the conductive feature is formed. In an embodiment, the implantation process is performed after the DARC layer is formed.

Embodiments of a semiconductor device structure and method for forming the same are provided in the disclosure. In some embodiments, the semiconductor device structure includes a first mask layer and a second mask layer disposed over a semiconductor substrate, and a conductive feature penetrating through the first mask layer and the second mask layer to connect to a conductive pad in the semiconductor substrate. The conductive feature has a serpentine pattern in the top view, and an implantation process is performed to introduce a doping species (e.g., carbon) into the second mask layer in the formation of the semiconductor device structure, thereby reducing the stress of the second mask layer. As a result, the device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
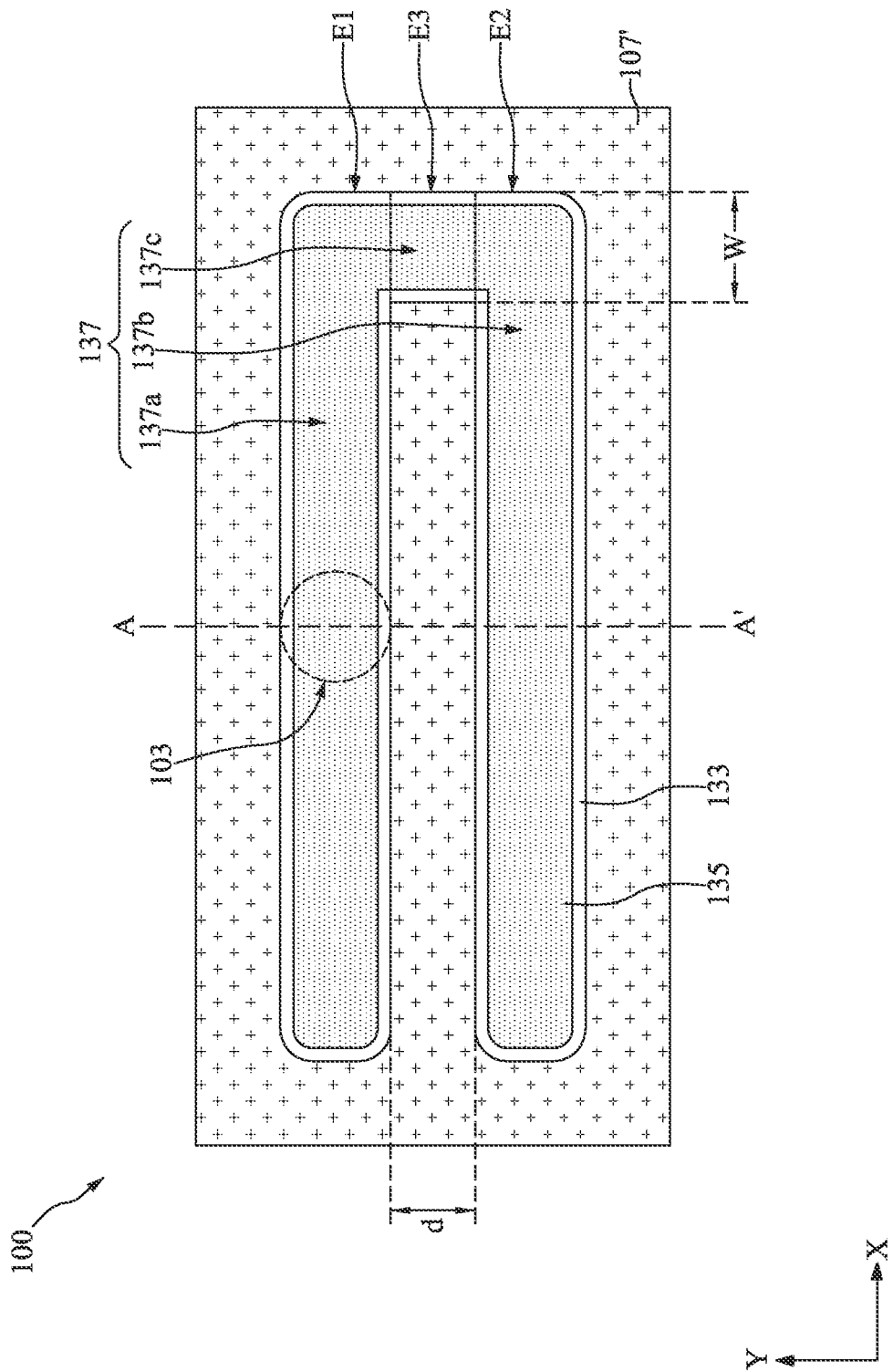
FIG. 1 is a top view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
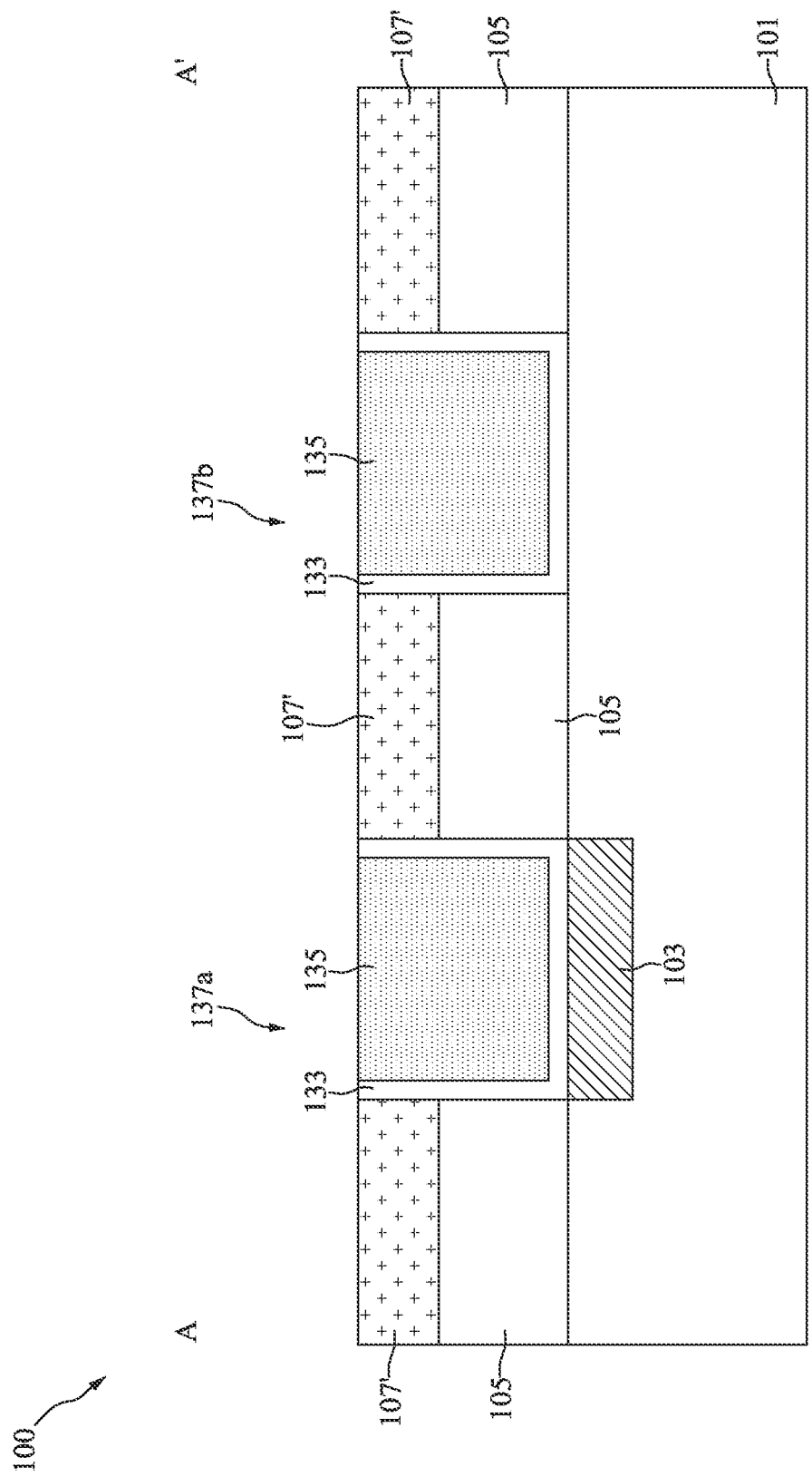
FIG. 2 is a cross-sectional view illustrating the semiconductor device structure along the sectional line A-A' of FIG. 1, in accordance with some embodiments.

FIG. 1 is a top view illustrating a semiconductor device structure 100, and FIG. 2 is a cross-sectional view illustrating the semiconductor device structure 100 along the sectional line A-A' of FIG. 1, in accordance with some embodiments. As shown in FIGS. 1 and 2, the semiconductor device structure 100 includes a conductive pad 103 disposed in a semiconductor substrate 101, a first mask layer 105 disposed over the semiconductor substrate 101, and a second mask layer 107' disposed over the first mask layer 105. The second mask layer 107' is also referred to herein as a doped second mask layer 107'.

In some embodiments, the semiconductor device structure 100 also includes a conductive feature 137 disposed in the first mask layer 105 and the second mask layer 107'. In some embodiments, the conductive feature 137 penetrates through the first mask layer 105 and the second mask layer 107' to connect to the conductive pad 103. Specifically, the conductive feature 137 is physically and electrically connected to the conductive pad 103. Moreover, the conductive feature 137 includes a conductive layer 135 and a barrier layer 133 separating to the conductive layer 135 from the conductive pad 103, the semiconductor substrate 101, the first mask layer 105, and the second mask layer 107'.

It should be noted that the conductive feature 137 has a serpentine (or bending) pattern in the top view of FIG. 1. In some embodiments, the serpentine pattern of the conductive feature 137 includes a first line segment 137a and a second line segment 137b extending parallel to each other, and a connecting segment 137c extending between the first line segment 137a and the second line segment 137b. For example, the first line segment 137a and the second line segment 137b extend along the X-direction, and the connecting segment 137c extends along the Y-direction and physically connecting the first line segment 137a and the second line segment 137b. In some embodiments, the X-direction is perpendicular to the Y-direction, and both the X-direction and the Y-direction are parallel to the top surface of the conductive feature 137.

The dotted lines indicating the boundaries of the first line segment 137a, the connecting segment 137c, and the second line segment 137b in FIG. 1 are used to clarify the disclosure. No obvious interfaces exist between the first line segment 137a, the connecting segment 137c, and the second line segment 137b. In some embodiments, the connecting segment 137c has a width "w" along the X-direction, and a shortest distance "d" between the first line segment 137a and the second line segment 137b is less than twice of the width "w" of the connecting segment 137c. In some embodiments, the shortest distance "d" is in the Y-direction.

In addition, as shown in the top view of FIG. 1, the edge E1 of the first line segment 137a is substantially aligned with the edge E2 of the second line segment 137b and the edge E3 of the connecting segment 137c, in accordance with some embodiments. Within the context of this disclosure, the word substantially means preferably at least 90%, more preferably 95%, even more preferably 98%, and most preferably 99%.

Figure 3:
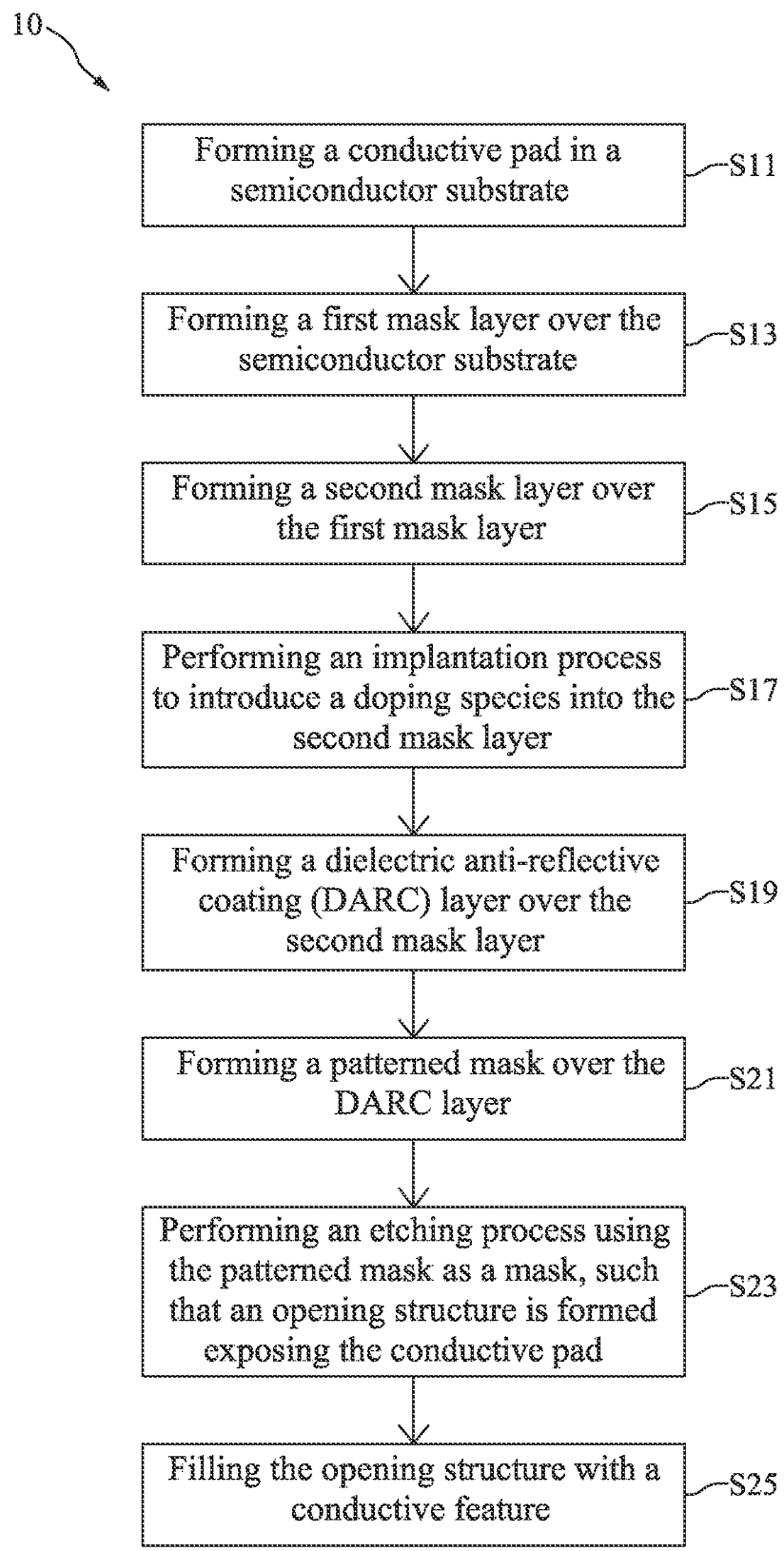
FIG. 3 is a flow diagram illustrating a method for forming a semiconductor device structure, in accordance with some embodiments.
Figure 4:
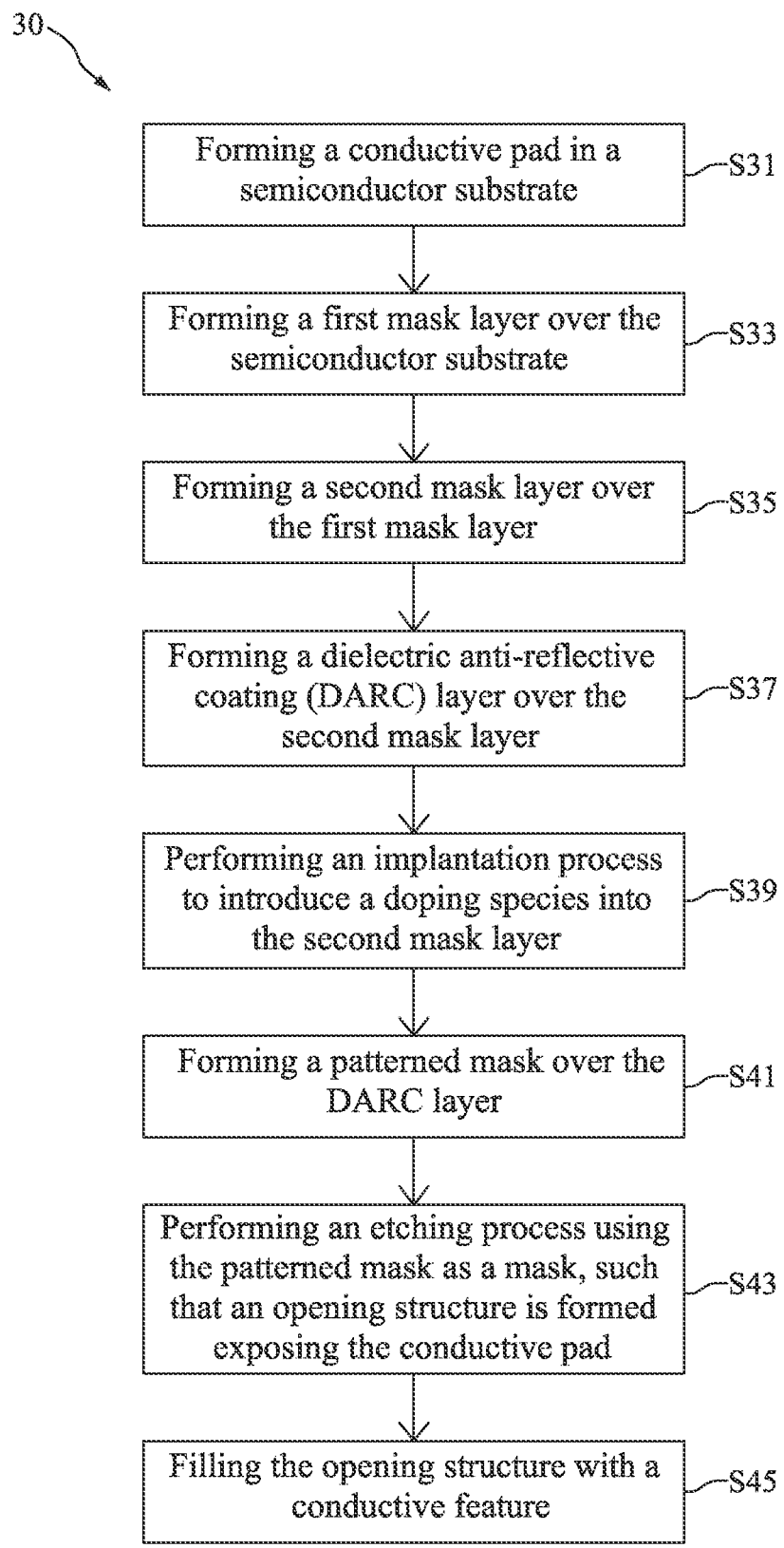
FIG. 4 is a flow diagram illustrating a method for forming a semiconductor device structure, in accordance with some embodiments.

FIG. 3 is a flow diagram illustrating a method 10 for forming a semiconductor device structure (e.g., the semiconductor device structure 100), and the method 10 includes steps S11, S13, S15, S17, S19, S21, S23 and S25, in accordance with some embodiments. FIG. 4 is a flow diagram illustrating another method 30 for forming a semiconductor device structure (e.g., the semiconductor device structure 100), and the method 30 includes steps S31, S33, S35, S37, S39, S41, S43 and S45, in accordance with some embodiments. The steps S11 to S25 of FIG. 3 and the steps S31 to S45 of FIG. 4 are elaborated in connection with the following figures.

Figure 5:
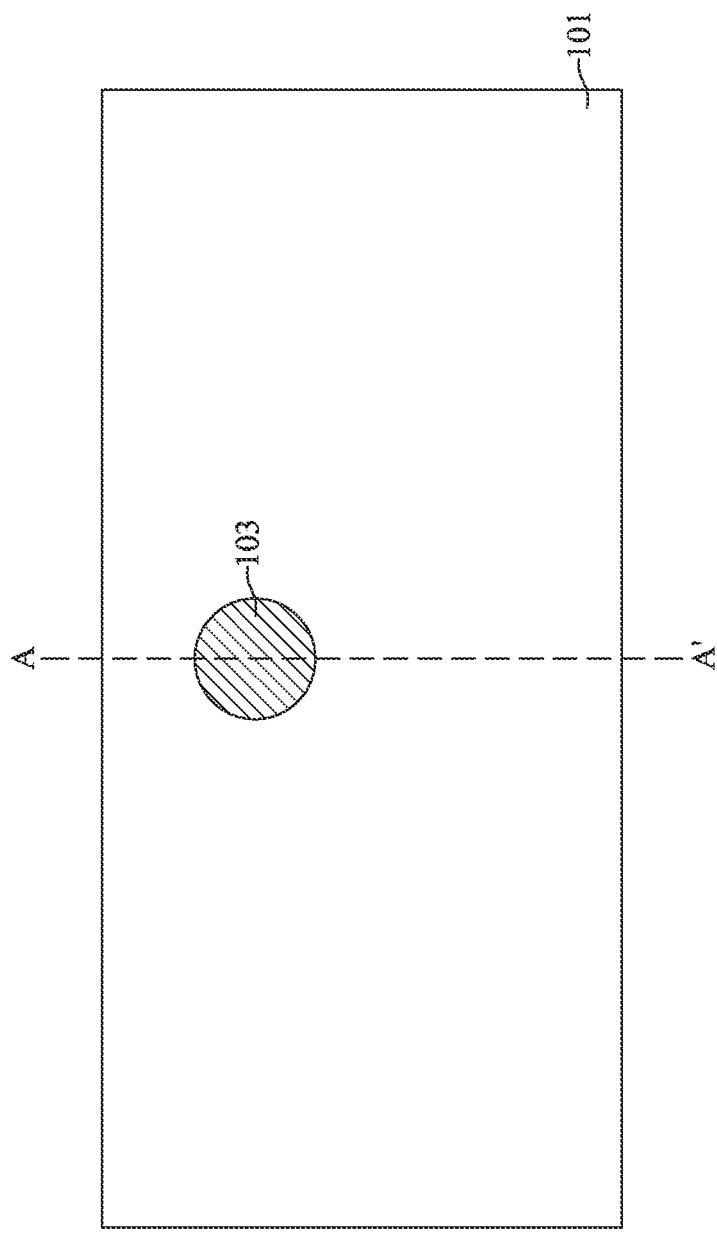
FIG. 5 is a top view illustrating an intermediate stage of forming a conductive pad in a semiconductor substrate during the formation of the semiconductor device structure, in accordance with some embodiments.
Figure 6:
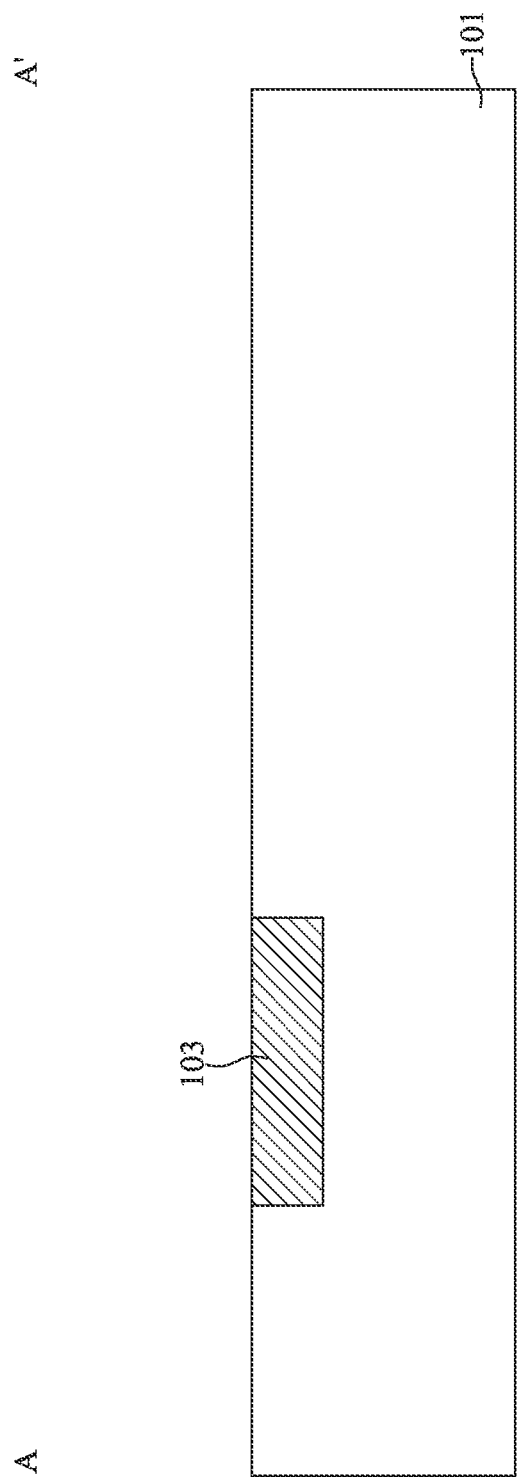
FIG. 6 is a cross-sectional view illustrating an intermediate stage in the formation of the semiconductor device structure along the sectional line A-A' of FIG. 5, in accordance with some embodiments.

FIG. 5 is a top view illustrating an intermediate stage of forming the semiconductor device structure 100, and FIG. 6 is a cross-sectional view taken along the sectional line A-A' of FIG. 5, in accordance with some embodiments. As shown in FIGS. 5 and 6, the semiconductor substrate 101 is provided, and the conductive pad 103 is formed in the semiconductor substrate 101. The respective step is illustrated as the step S11 in the method 10 shown in FIG. 3.

The semiconductor substrate 101 may be a portion of an integrated circuit (IC) chip that includes various passive and active electronic elements, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field effect transistors (FinFETs), other suitable IC components, or combinations thereof.

Depending on the IC fabrication stage, the semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The semiconductor substrate 101 has been simplified for the sake of clarity. It should be noted that additional features can be added in the semiconductor substrate 101, and some of the features described below can be replaced, modified, or eliminated in other embodiments.

In some embodiments, the top surface of the conductive pad 103 is exposed on the top surface of the semiconductor substrate 101. The conductive pad 103 may be made of a conductive material, such as copper (Cu), tungsten (W), aluminum (Al), titanium (Ti), tantalum (Ta), gold (Au), silver (Ag), or a combination thereof. In addition, the conductive pad 103 may be formed by etching the semiconductor substrate 101 to form an opening, depositing a conductive material in the opening and over the top surface of the semiconductor substrate 101, and performing a planarization process to remove excess portions of the conductive material outside of the opening.

Figure 7:
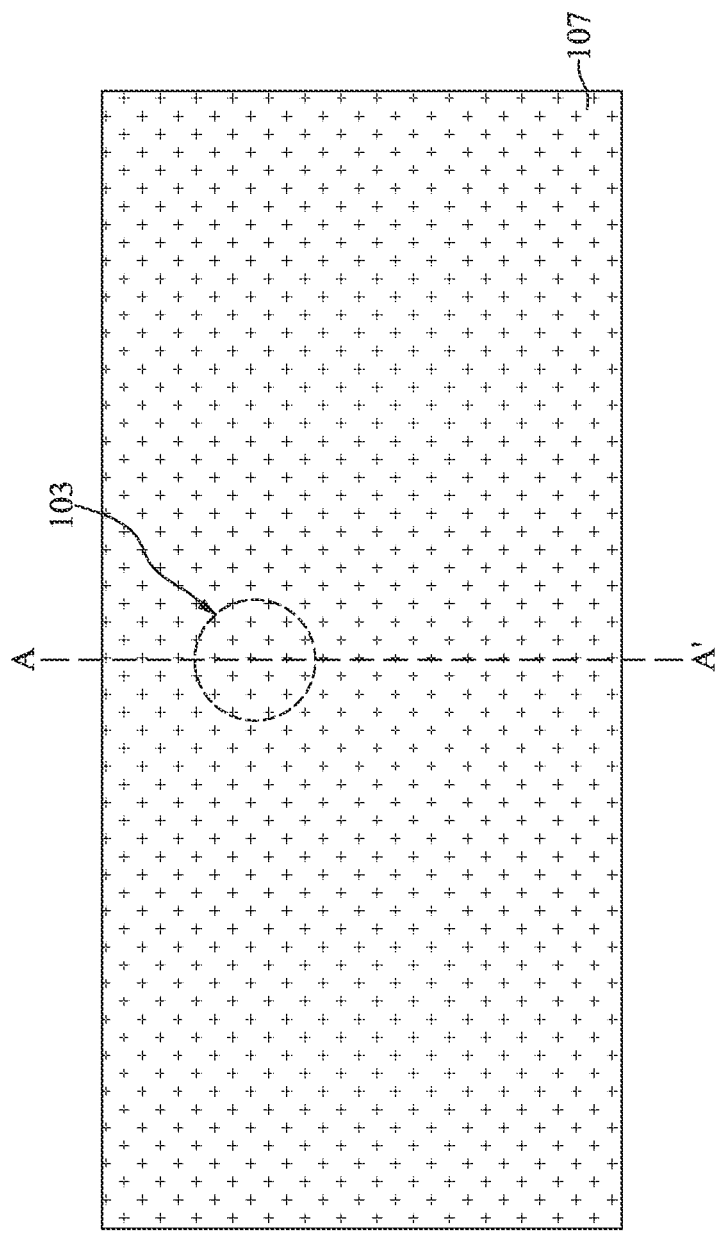
FIG. 7 is a top view illustrating an intermediate stage of forming a first mask layer and a second mask layer over a semiconductor substrate during the formation of the semiconductor device structure, in accordance with some embodiments.
Figure 8:
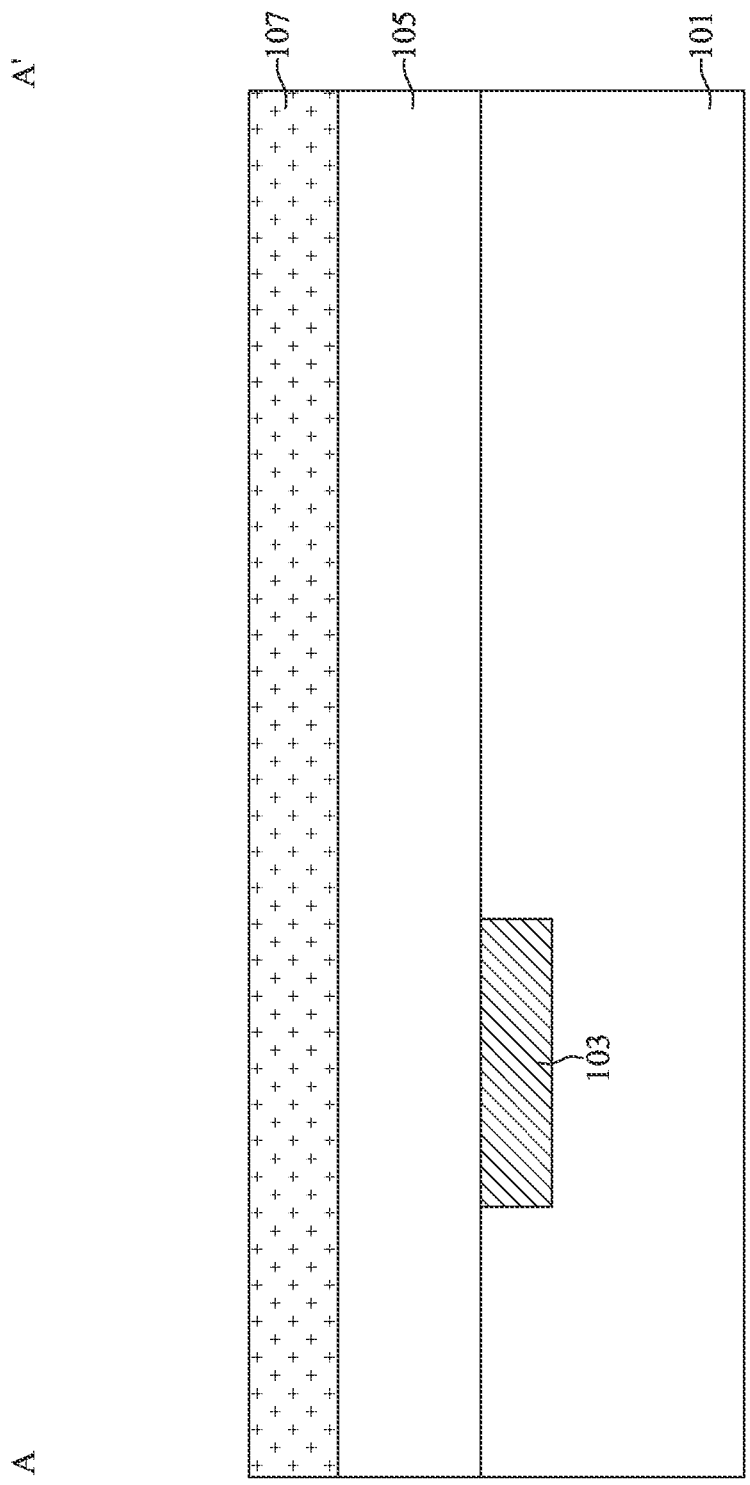
FIG. 8 is a cross-sectional view illustrating an intermediate stage in the formation of the semiconductor device structure along the sectional line A-A' of FIG. 7, in accordance with some embodiments.

FIG. 7 is a top view illustrating an intermediate stage of forming the semiconductor device structure 100, and FIG. 8 is a cross-sectional view taken along the sectional line A-A' of FIG. 7, in accordance with some embodiments. As shown in FIGS. 7 and 8, the first mask layer 105 is formed over the semiconductor substrate 101 and covering the top surface of the conductive pad 103, and the second mask layer 107 is formed over the first mask layer 105. The respective steps are illustrated as the steps S13 and S15 in the method 10 shown in FIG. 3.

In some embodiments, the first mask layer 105 is made of dielectric material, such as silicon nitride, silicon oxynitride, or a combination thereof, and the first mask layer 105 is formed by a deposition process, such as a chemical vapor deposition (CVD) process, a physical vapor deposition (PVD) process, a spin coating process, or another applicable process. Moreover, in some embodiments, the second mask layer 107 includes a carbon-containing material, such as a diamond-like carbon material having sp3 bonding, and the processes for forming the second mask layer 107 are similar to, or the same as those for forming the first mask layer 105. In some embodiments, the first mask layer 105 and the second mask layer 107 are made of different materials.

Figure 9:
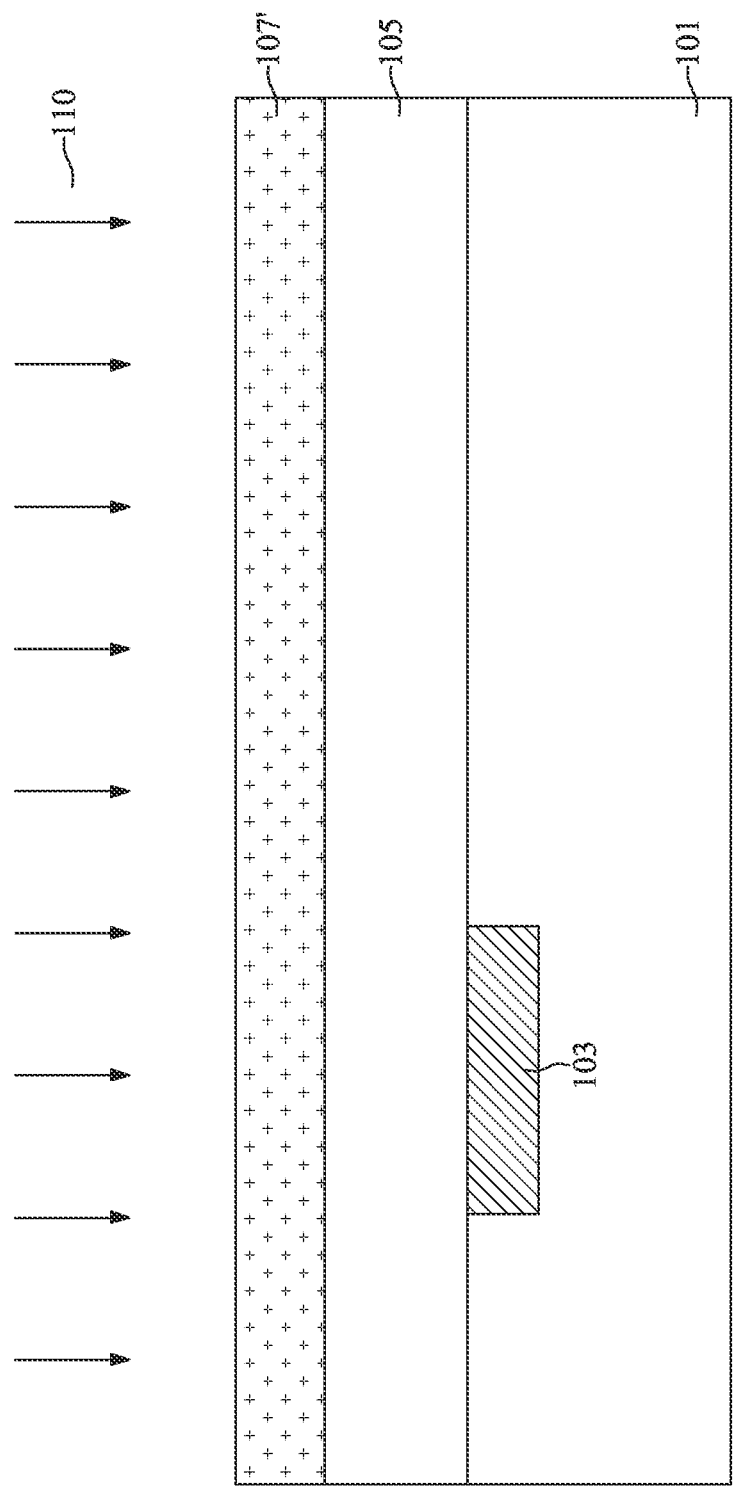
FIG. 9 is a cross-sectional view illustrating an intermediate stage of performing an implantation process during the limitation of the semiconductor device structure, in accordance with some embodiments.

FIG. 9 is a cross-sectional view illustrating an intermediate stage of performing an implantation process 110 during the formation of the semiconductor device structure 100, in accordance with some embodiments. In some embodiments, the implantation process 110 is performed directly on the second mask layer 107 (see FIG. 8) to introduce a doping species into the second mask layer 107. The respective step is illustrated as the step S17 in the method 10 shown in FIG. 3.

In some embodiments, the doping species implanted into the second mask layer 107 includes carbon. By implanting dopants (e.g., carbon) inside the second mask layer 107, the stress of the second mask layer 107 may be reduced, and the device performance of the final structure may be improved. After the implantation process 110 is performed, the (doped) second mask layer 107' is obtained.

Figure 10:
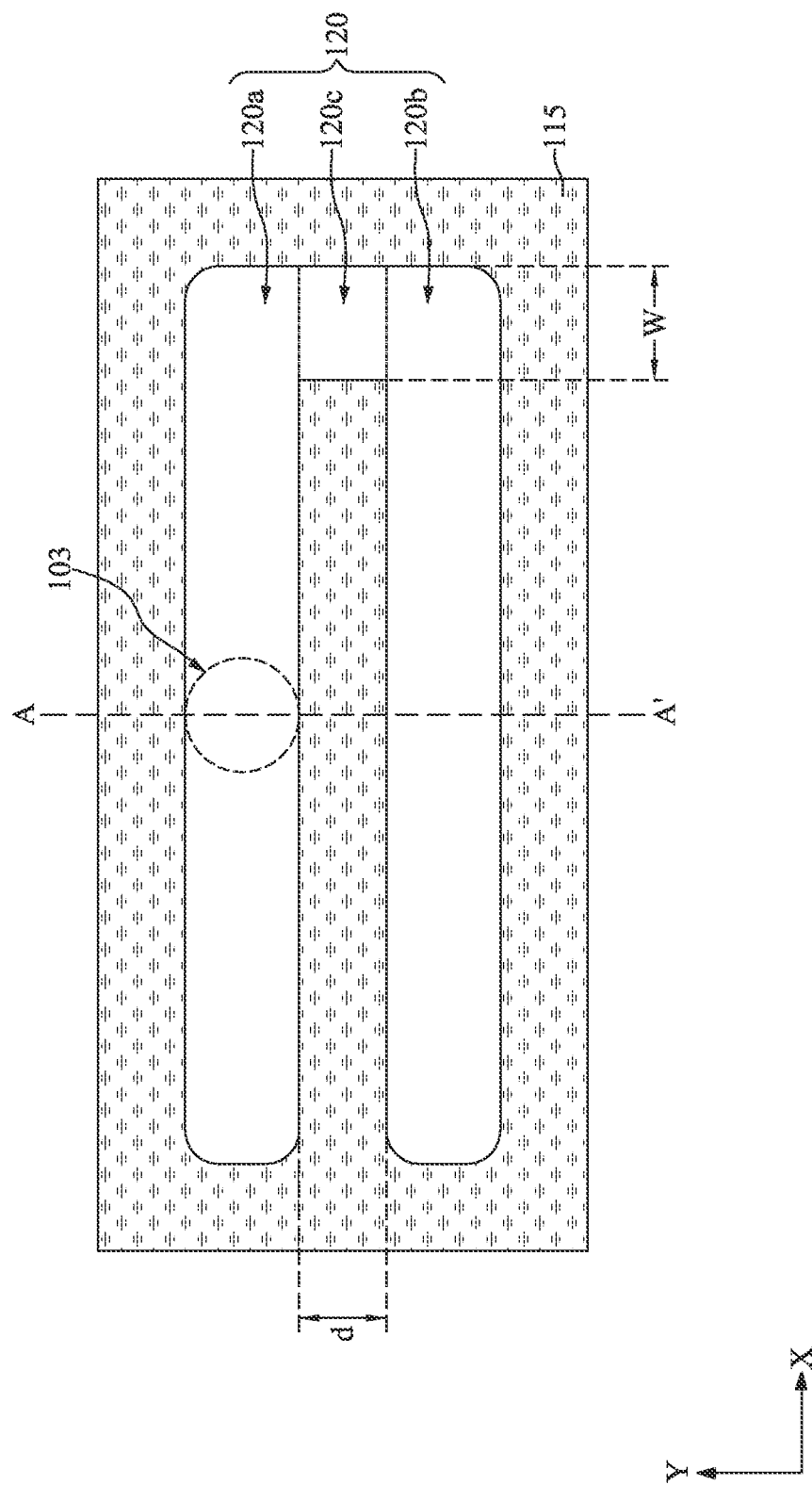
FIG. 10 is a top view illustrating an intermediate stage of foaming a dielectric anti-reflective coating (DARC) layer and a patterned mask over the second mask layer during the formation of the semiconductor device structure, in accordance with some embodiments.
Figure 11:
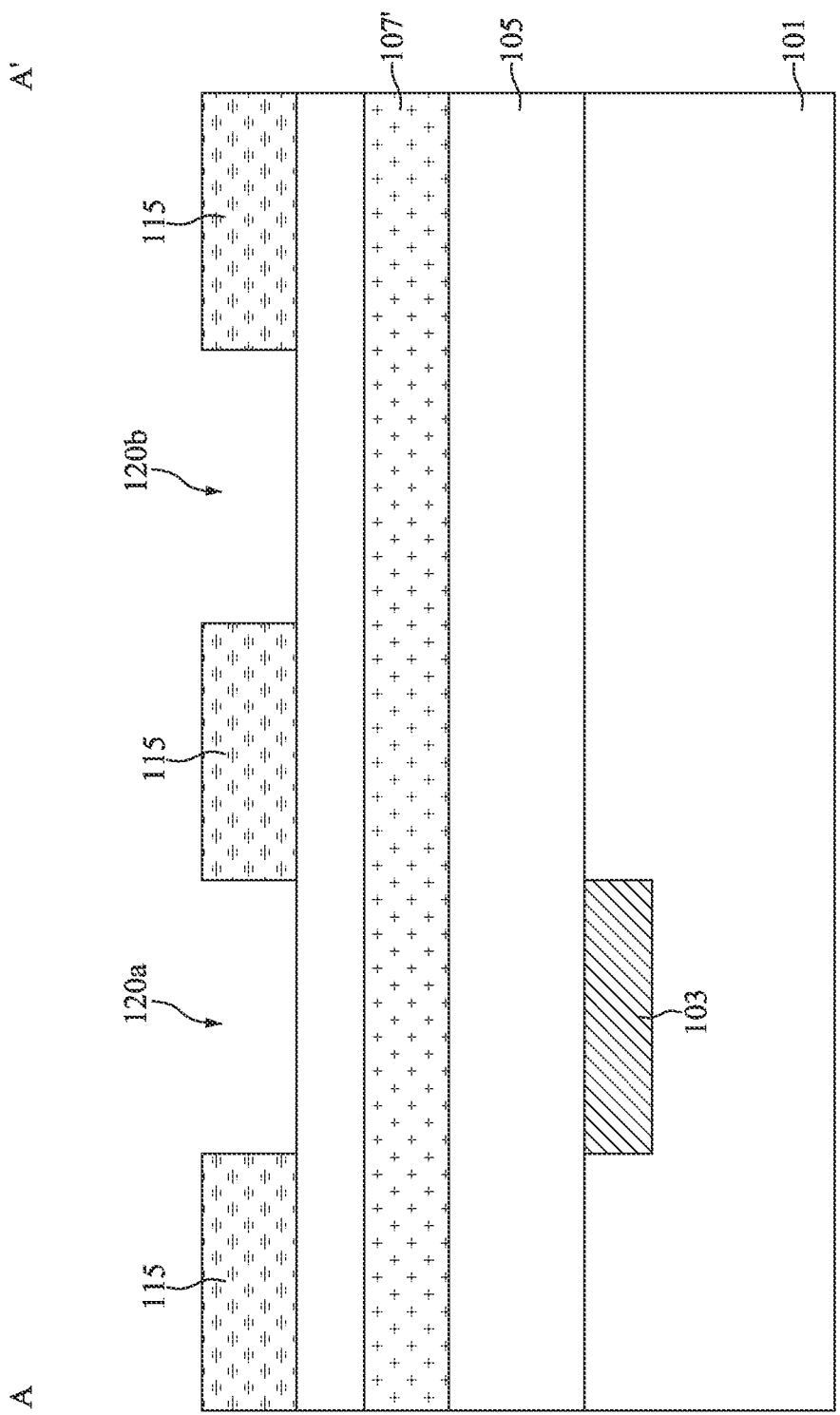
FIG. 11 is a cross-sectional view illustrating an intermediate stage in the formation of the semiconductor device structure along the sectional line A-A' of FIG. 10, in accordance with some embodiments.

FIG. 10 is a top view illustrating an intermediate stage of forming the semiconductor device structure 100, and FIG. 11 is a cross-sectional view taken along the sectional line A-A' of FIG. 10, in accordance with some embodiments. As shown in FIGS. 10 and 11, a dielectric anti-reflective coating (DARC) layer 113 is formed over the (doped) second mask layer 107', and a patterned mask 115 is formed over the DARC layer 113. The respective steps are illustrated as the steps S19 and S21 in the method 10 shown in FIG. 3.

In some embodiments, the DARC layer 113 includes silicon oxide, silicon nitride, silicon oxynitride, or a combination thereof, and the DRAC layer 113 is formed by a deposition process, such as a CVD process, a PVD process, a spin coating process, or another applicable process. Moreover, the composition and thickness of the DARC layer 113 may be tuned to provide minimal reflection and high contrast for desired wavelengths employed during subsequent lithographic process.

In addition, the patterned mask 115 has an opening structure 120. In some embodiments, the opening structure 120 has a serpentine (or bending) pattern in the top view of FIG. 10. In some embodiments, the serpentine pattern of the opening structure 120 includes a first line segment 120a and a second line segment 120b extending parallel to each other, and a connecting segment 120c extending between the first line segment 120a and the second line segment 120b.

For example, the first line segment 120a and the second line segment 120b extend along the X-direction, and the connecting segment 120c extends along the Y-direction and physically connecting the first line segment 120a and the second line segment 120b. In some embodiments, the X-direction is perpendicular to the Y-direction, and both the X-direction and the Y-direction are parallel to the top surface of the semiconductor substrate 101. Furthermore, in some embodiments, the connecting segment 120c has a width "w" along the X-direction, and a shortest distance "d" between the first line segment 120a and the second line segment 120b is less than twice of the width "w" of the connecting segment 120c. In some embodiments, the shortest distance "d" is in the Y-direction.

Figure 12:
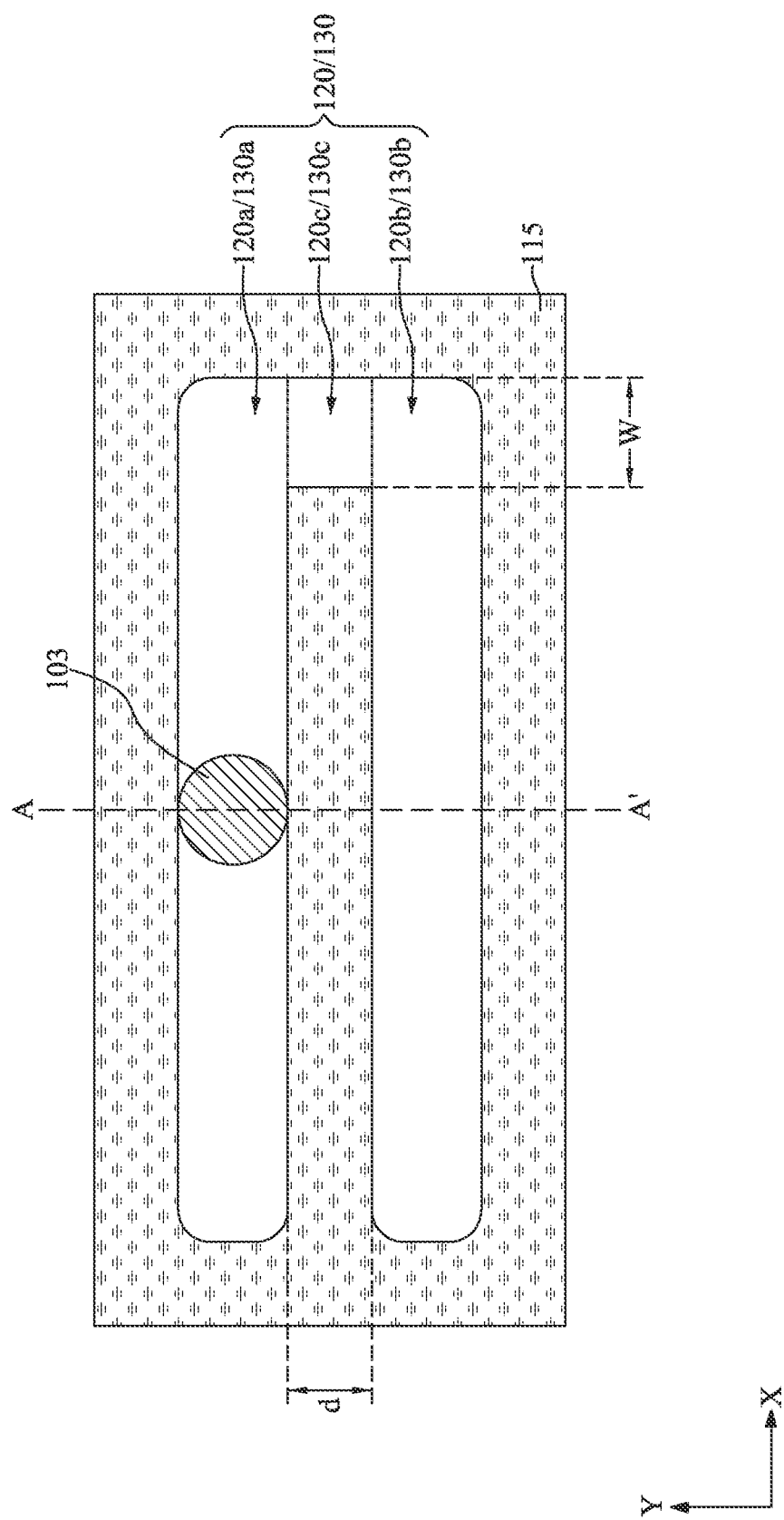
FIG. 12 is a top view illustrating an intermediate stage of forming an opening structure in the first mask layer and the second mask layer during the formation of the semiconductor device structure, in accordance with some embodiments.
Figure 13:
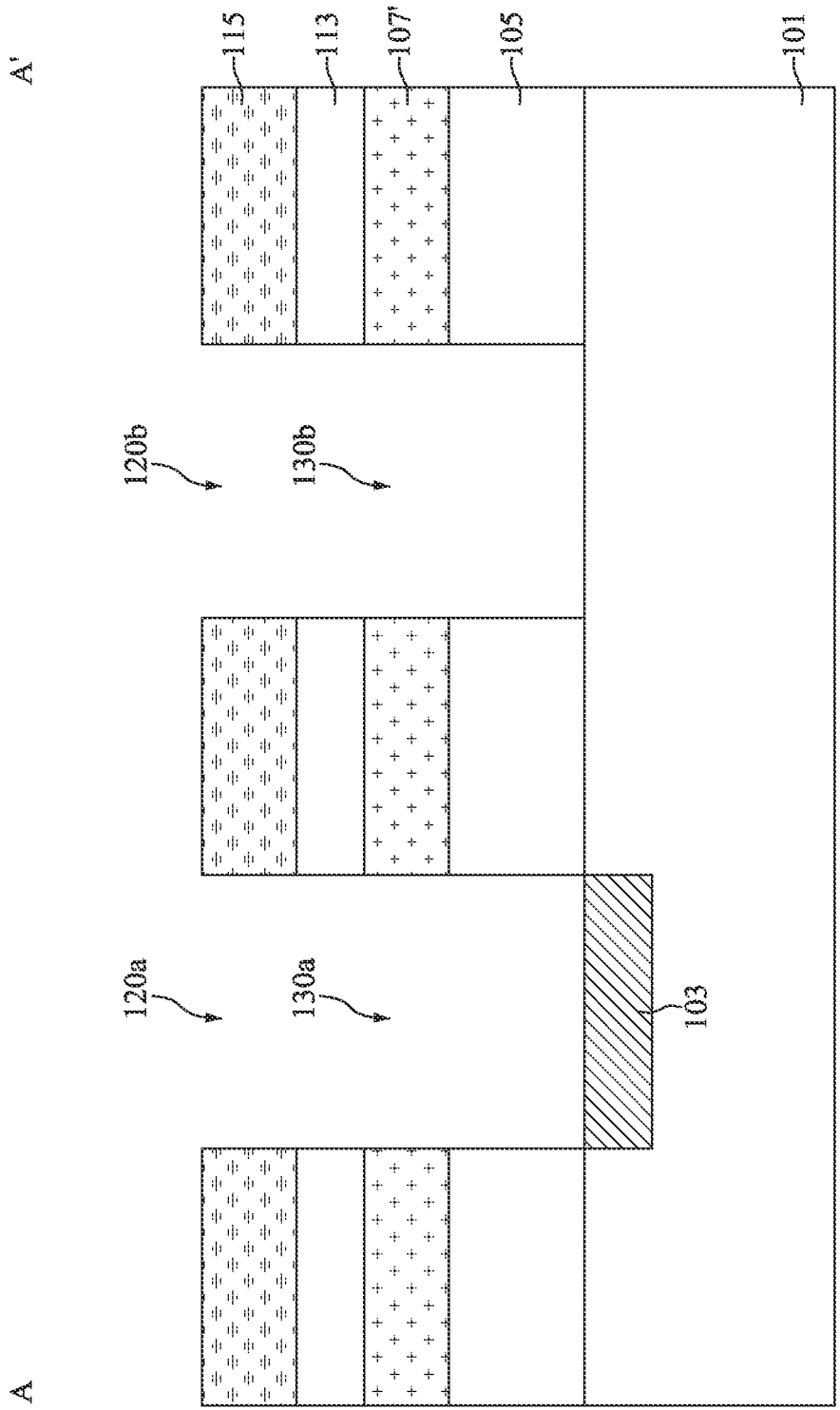
FIG. 13 is a cross-sectional view illustrating an intermediate stage in the formation of the semiconductor device structure along the sectional line A-A' of FIG. 12, in accordance with some embodiments.

FIG. 12 is a top view illustrating an intermediate stage of forming the semiconductor device structure 100, and FIG. 13 is a cross-sectional view taken along the sectional line A-A' of FIG. 12, in accordance with some embodiments. As shown in FIGS. 12 and 13, an etching process is performed using the patterned mask 115 as a mask, such that an opening structure 130 is formed exposing the conductive pad 103 and the semiconductor substrate 101. The respective step is illustrated as the step S21 in the method 10 shown in FIG. 3.

In some embodiments, the etching process is a wet etching process, a dry etching process, or a combination thereof. In some embodiments, the opening structure 130 is under the opening structure 120 of the patterned mask 115 and penetrating through the DARC layer 113, the (doped) second mask layer 107' and the first mask layer 105. In some embodiments, the opening structure 130 has a serpentine (or bending) pattern in the top view of FIG. 12, which is similar to the opening structure 120 of the patterned mask 115. In some embodiments, the serpentine pattern of the opening structure 130 includes a first line segment 130a and a second line segment 130b extending parallel to each other, and a connecting segment 130c extending between the first line segment 130a and the second line segment 130b.

For example, the first line segment 130a and the second line segment 130b extend along the X-direction, and the connecting segment 130c extends along the Y-direction and physically connecting the first line segment 130a and the second line segment 130b. In some embodiments, the X-direction is perpendicular to the Y-direction, and both the X-direction and the Y-direction are parallel to the top surface of the semiconductor substrate 101. Furthermore, in some embodiments, the connecting segment 130c has a width "w" along the X-direction, and a shortest distance "d" between the first line segment 130a and the second line segment 130b is less than twice of the width "w" of the connecting segment 130c. In some embodiments, the shortest distance "d" is in the Y-direction.

Figure 14:
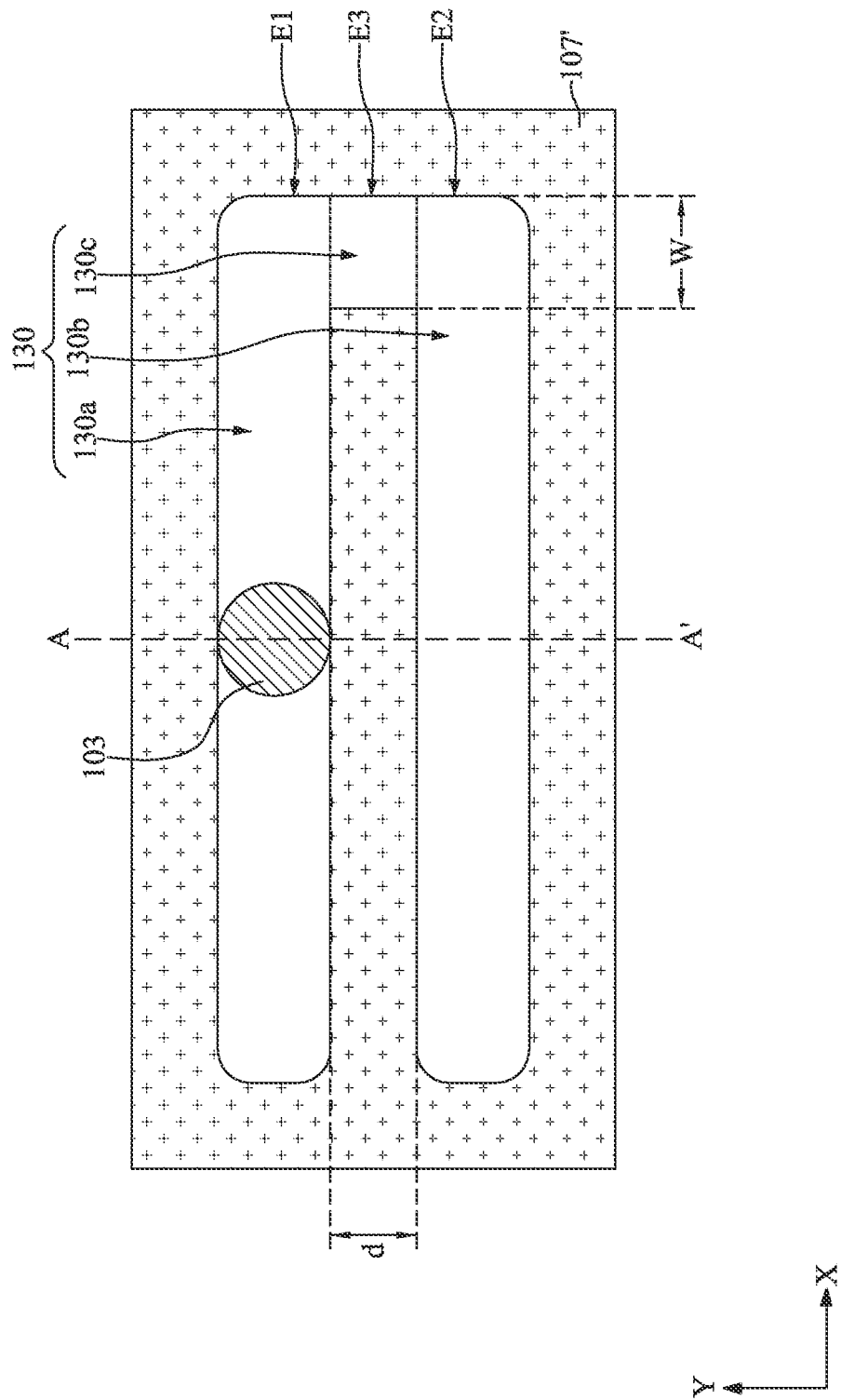
FIG. 14 is a top view illustrating an intermediate stage of removing the DARC layer and the patterned mask during the formation of the semiconductor device structure, in accordance with some embodiments.
Figure 15:
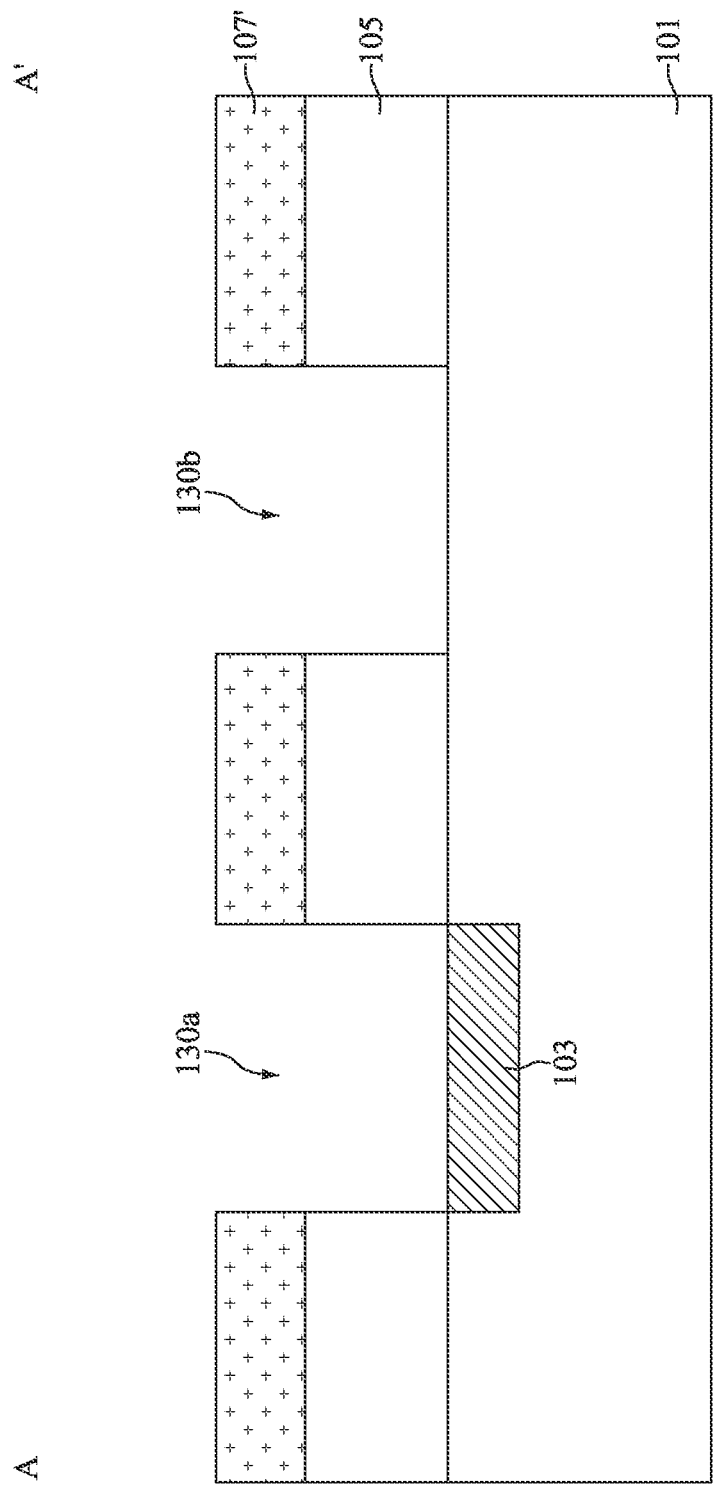
FIG. 15 is a cross-sectional view illustrating an intermediate stage in the formation of the semiconductor device structure along the sectional line A-A' of FIG. 14, in accordance with some embodiments.

FIG. 14 is a top view illustrating an intermediate stage of forming the semiconductor device structure 100, and FIG. 15 is a cross-sectional view taken along the sectional line A-A' of FIG. 14, in accordance with some embodiments. As shown in FIGS. 14 and 15, the patterned mask 115 and the DARC layer 113 are removed, in accordance with some embodiments.

In some embodiments, the patterned mask 115 and the DARC layer 113 are removed using an ashing process, a wet etching process, or another applicable removal process. After the removal of the patterned mask 115 and the DARC layer 113, a remaining portion of the opening structure 130 including the first line segment 130a, the second segment 130b and the connecting segment 130c remains in the first mask layer 105 and the second mask layer 107'. In addition, as shown in the top view of FIG. 14, the edge E1 of the first line segment 130a of the opening structure 130 is substantially aligned with the edge E2 of the second line segment 137b of the opening structure 130 and the edge E3 of the connecting segment 137c of the opening structure 130, in accordance with some embodiments.

Figure 16:
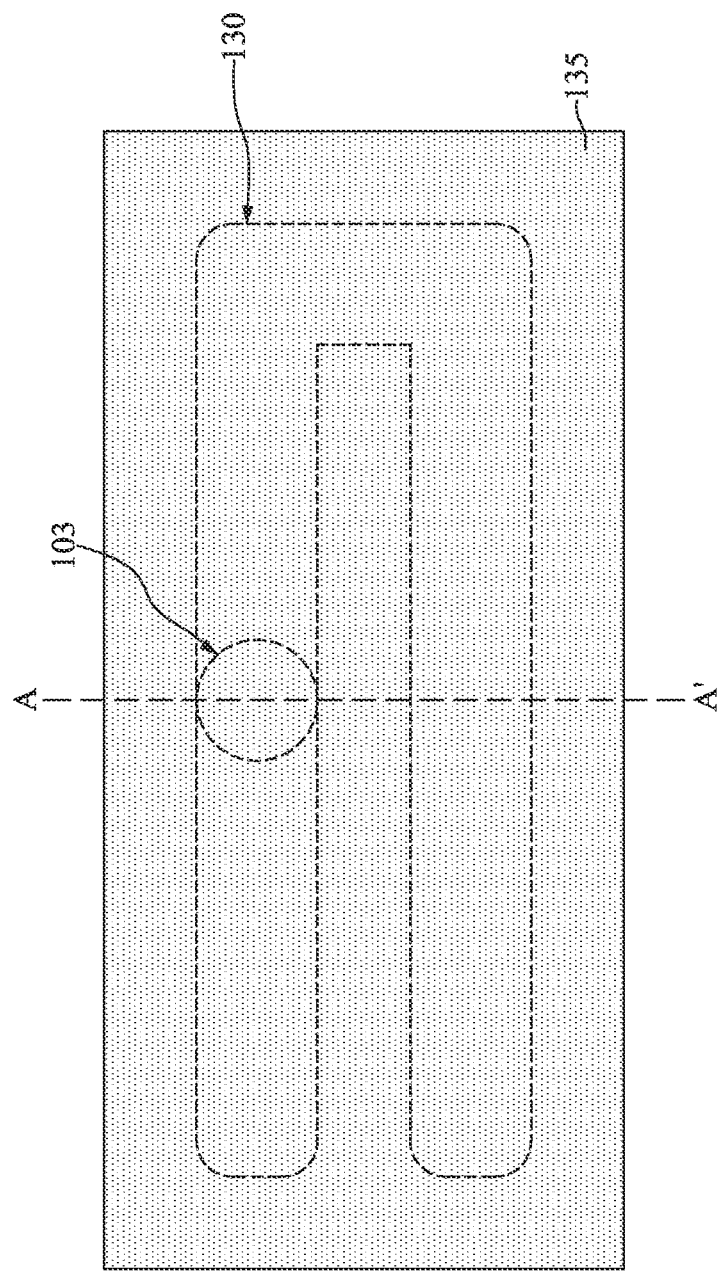
FIG. 16 is a top view illustrating an intermediate stage of forming a barrier layer and a conductive layer in the opening structure and aver the second mask layer during the formation of the semiconductor device structure, in accordance with some embodiments.
Figure 17:
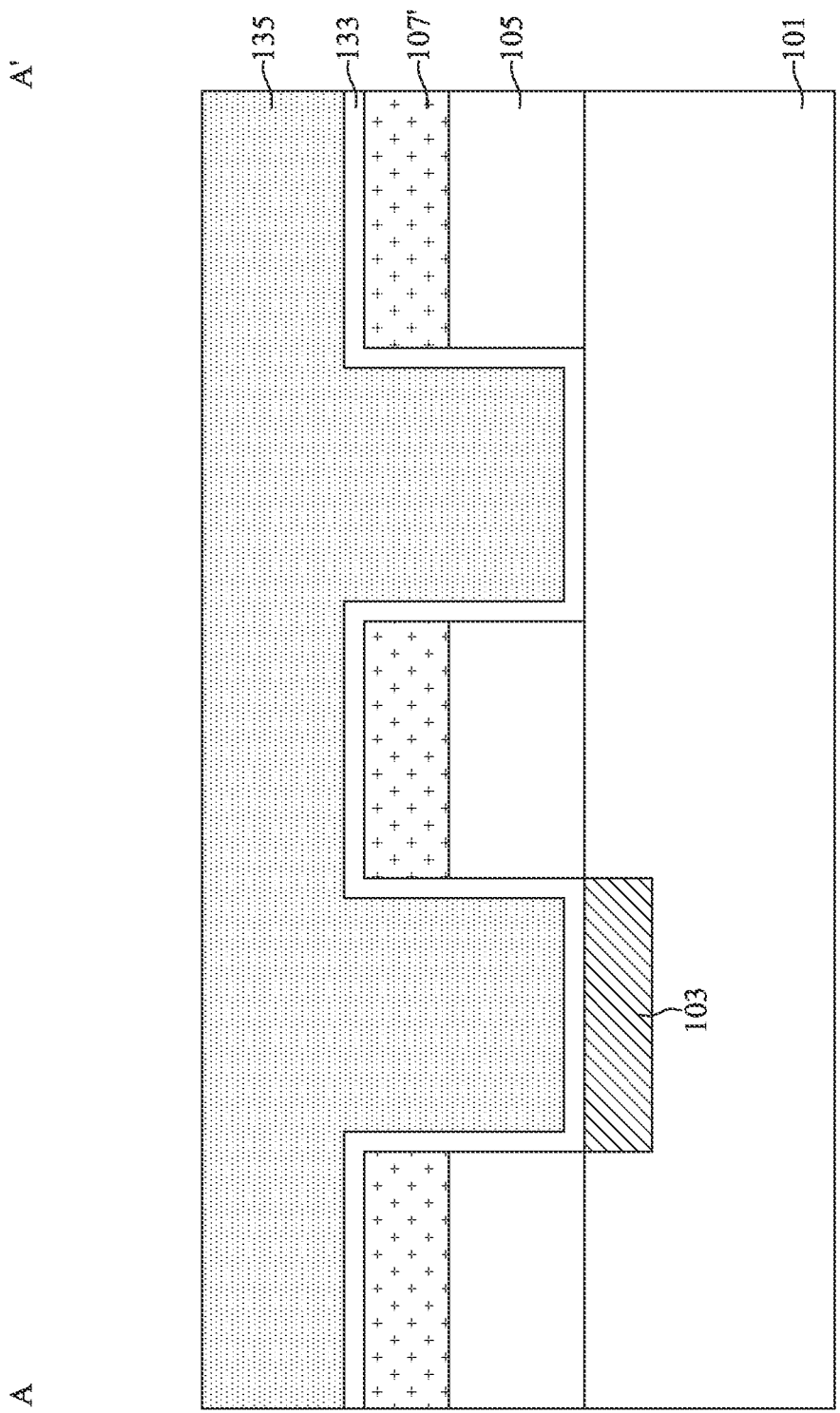
FIG. 17 is a cross-sectional view illustrating an intermediate stage in the formation of the semiconductor device structure along the sectional line A-A' of FIG. 16, in accordance with some embodiments.

FIG. 16 is a top view illustrating an intermediate stage of forming the semiconductor device structure 100, and FIG. 17 is a cross-sectional view taken along the sectional line A-A' of FIG. 16, in accordance with some embodiments. As shown in FIGS. 16 and 17, the barrier layer 133 is formed lining the opening structure 130 and extending over the top surface of the second mask layer 107', and the conductive layer 135 is formed over the barrier layer 133. In some embodiments, the conductive layer 135 is separated from the second mask layer 107', the first mask layer 105, the conductive pad 103 and the semiconductor substrate 101 by the barrier layer 133.

In some embodiments, the barrier layer 133 includes titanium (Ti), titanium nitride (TiN), tantalum (Ta), tantalum nitride (TaN), cobalt tungsten (CoW), another applicable material, or a combination thereof, and the barrier layer 133 is formed by a deposition process, such as a CVD process, a PVD process, an ALD process, a metal organic chemical vapor deposition (MOCVD) process, a sputtering process, a plating process, or another applicable process. In some embodiments, the conductive layer 135 includes copper (Cu), tungsten (W), aluminum (Al), titanium (Ti), tantalum (Ta), gold (Au), silver (Ag), or a combination thereof, or another applicable conductive material. Some processes used to form the conductive layer 135 are similar to, or the same as those used to form the barrier layer 133, and details thereof are not repeated herein.

Referring back to FIGS. 1 and 2, after the conductive layer 135 is formed, a planarization process is performed on the barrier layer 133 and the conductive layer 135 until the second mask layer 107' is exposed, such that the conductive feature 137 is formed filling the opening structure 130. The respective step is illustrated as the step S23 in the method 10 shown in FIG. 3, in some embodiments, the planarization process is a chemical mechanical polishing (CMP) process.

After the conductive feature 137 is formed, the semiconductor device structure 100 is obtained. Moreover, a doping species, such as carbon, is introduced into the second mask layer 107 by the implantation process 110 (see FIG. 9). Therefore, the stress of the second mask layer 107 may be reduced, which improves the overall device performance.

Figure 18:
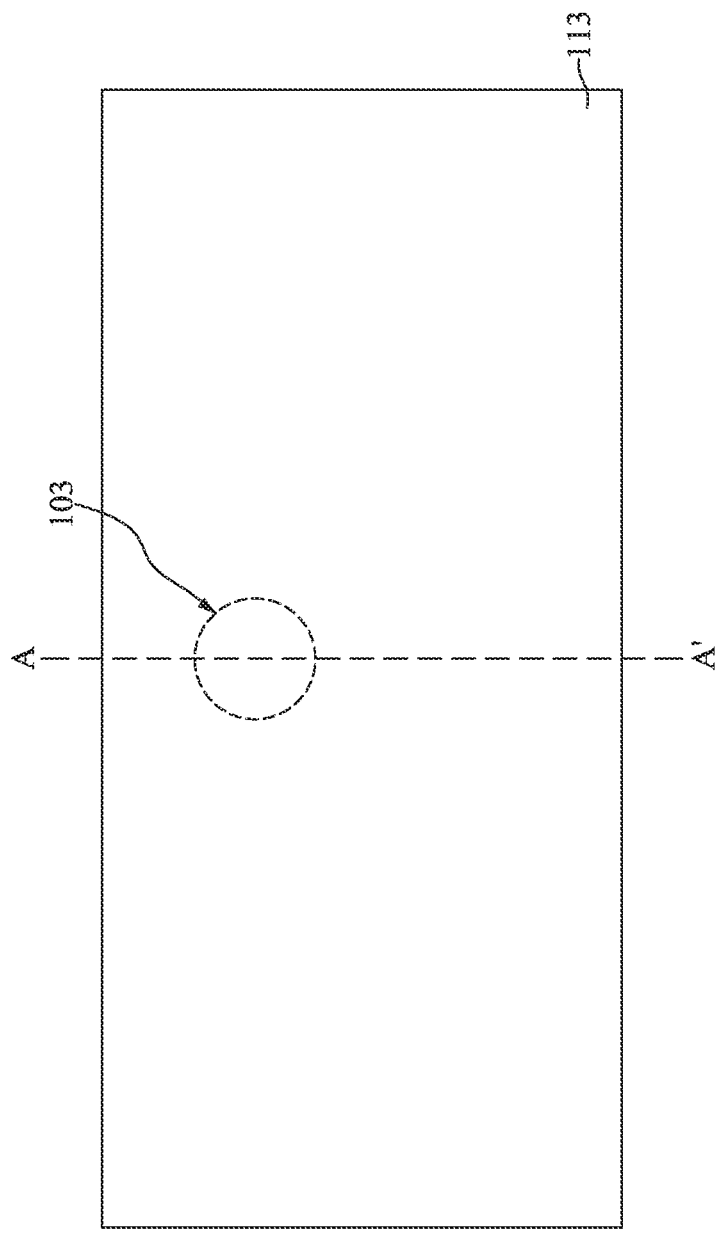
FIG. 18 is a top view illustrating an intermediate stage of farming a DARC layer over the second mask layer during the formation of the semiconductor device structure, in accordance with some other embodiments.
Figure 19:
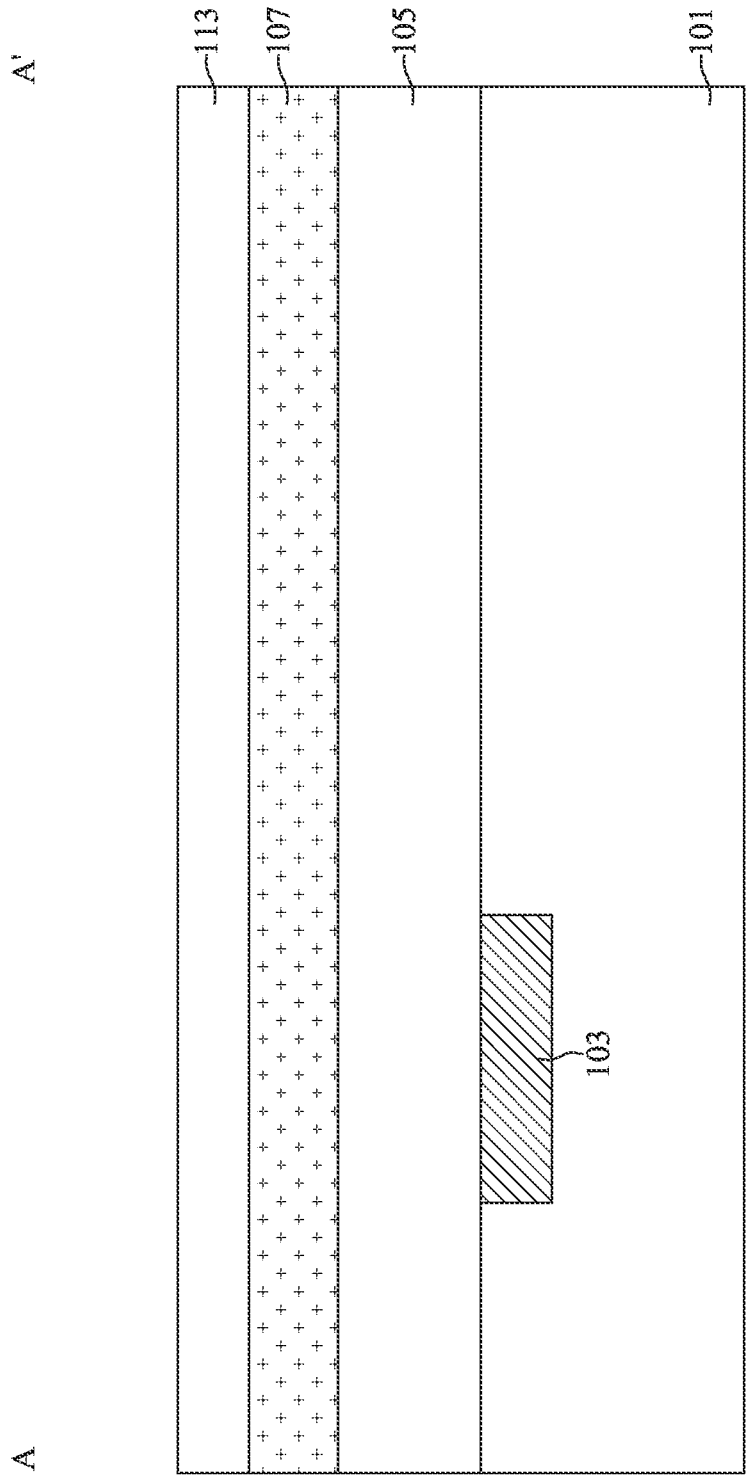
FIG. 19 is a cross-sectional view illustrating an intermediate stage in the formation of the semiconductor device structure along the sectional line A-A' of FIG. 18, in accordance with some other embodiments.

FIG. 18 is a top view illustrating an intermediate stage of forming the semiconductor device structure 100 following the step of FIGS. 7 and 8, and FIG. 19 is a cross-sectional view taken along the sectional line A-A' of FIG. 18, in accordance with some other embodiments. As shown in FIGS. 18 and 19, before the second mask layer 107 is doped by an implantation process, the DARC layer 113 is formed covering the second mask layer 107, in accordance with some embodiments. The respective step is illustrated as the step S37 in the method 30 shown in FIG. 4. It should be noted that the steps S31, S33, and S35 of the method 30 shown in FIG. 4 are the same as the steps S11, S13, and S15 of the method 10 shown in FIG. 3, respectively, and details thereof are not repeated herein.

Figure 20:
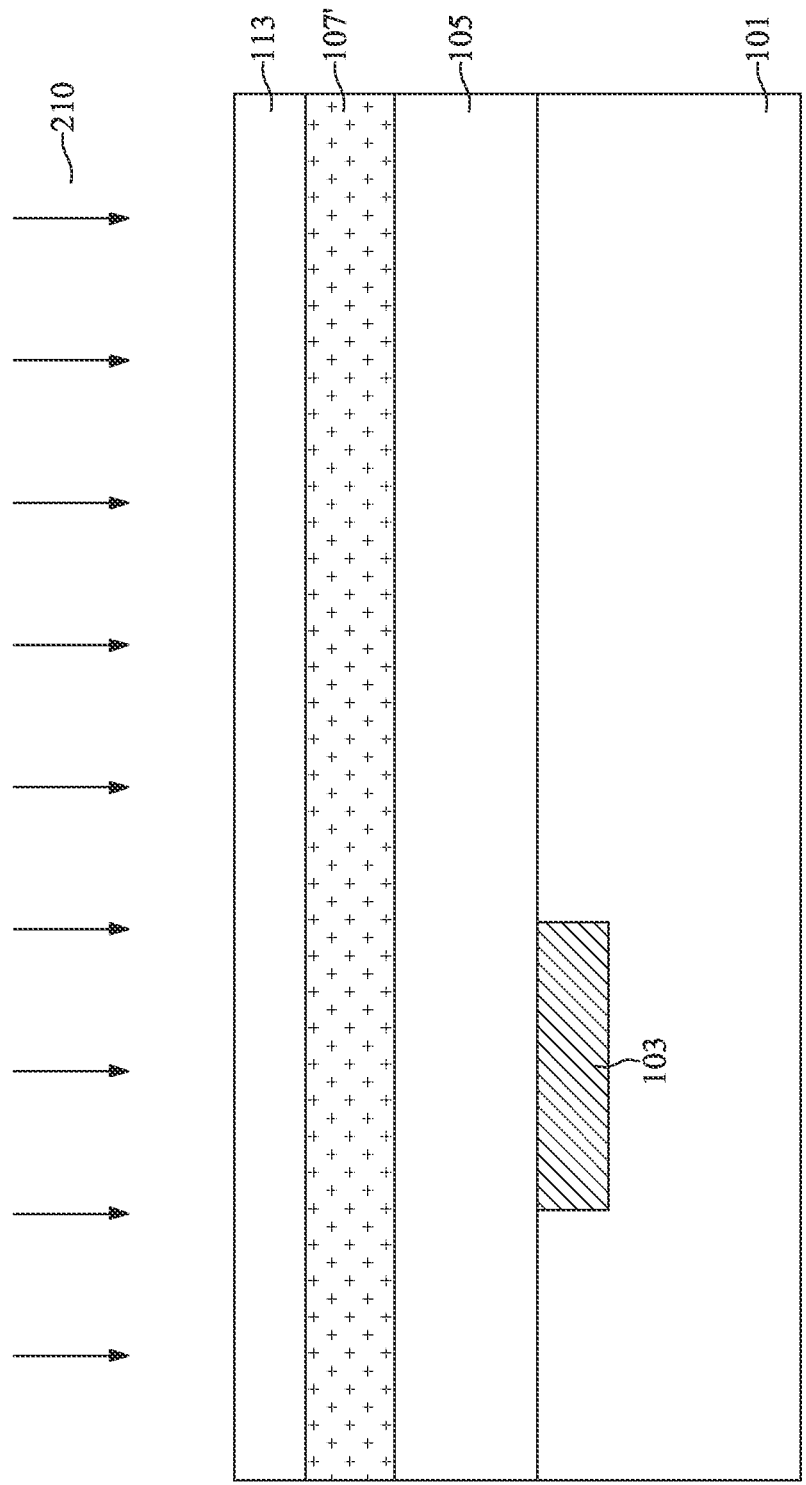
FIG. 20 is a cross-sectional view illustrating an intermediate stage of performing an implantation process during the formation of the semiconductor device structure, in accordance with some other embodiments.

FIG. 20 is a cross-sectional view illustrating an intermediate stage of performing an implantation process 210 during the formation of the semiconductor device structure 100 after the step of FIGS. 18 and 19, in accordance with some embodiments. In some embodiments, the is process 210 is performed to introduce a doping species into the second mask layer 107. The respective step is illustrated as the step S39 in the method 30 shown in FIG. 4.

In some embodiments, the doping species of the implantation process 210 penetrates through the DARC layer 113 to arrive the second mask layer 107, such that the (doped) second mask layer 107' is obtained. In some embodiments, the doping species implanted into the second mask layer 107 includes carbon.

By implanting dopants (e.g., carbon) inside the second mask layer 107, the stress of the second mask layer 107 may be reduced, and the device performance of the final structure may be improved. Following the step S39, the steps S41, S43, and S45 of the method 30 shown in FIG. 4 are the same as the steps S21, S23, and S25 of the method 10 shown in FIG. 3, respectively, and details thereof are not repeated herein.

Embodiments of the semiconductor device structure 100 and method for forming the same are provided in the disclosure. In some embodiments, the semiconductor device structure 100 includes the first mask layer 105 and the (doped) second mask layer 107' disposed over the semiconductor substrate 101, and the conductive feature 137 penetrating through the first mask layer 105 and the (doped) second mask layer 107' to connect to the conductive pad 103 in the semiconductor substrate 101. Moreover, an implantation process (e.g., the implantation process 110 or 210) is performed to introduce a doping species (e.g., carbon) into the second mask layer 107 in the formation of the semiconductor device structure 100, thereby reducing the stress of the second mask layer 107. As a result, the device performance may be improved.

In one embodiment of the present disclosure, a semiconductor device structure is provided. The semiconductor device structure includes a conductive pad disposed in a semiconductor substrate, and a first mask layer disposed over the semiconductor substrate. The semiconductor device structure also includes a second mask layer disposed over the first mask layer. The first mask layer and the second mask layer are made of different materials. The semiconductor device structure further includes a conductive feature penetrating through the first mask layer and the second mask layer to connect to the conductive pad. The conductive feature has a serpentine pattern in a top view.

In another embodiment of the present disclosure, a semiconductor device structure is provided. The semiconductor device structure includes a conductive pad disposed in a semiconductor substrate, and a first mask layer disposed over the semiconductor substrate. The semiconductor device structure also includes a second mask layer disposed over the first mask layer, and a conductive feature disposed in the first mask layer and the second mask layer and electrically connected to the conductive pad. The conductive feature includes a connecting segment extending along a first direction, and a first line segment and a second line segment extending along a second direction. The first line segment and the second line segment are physically connected by the connecting segment, and an edge of the connecting segment is substantially aligned with an edge of the first line segment and an edge of the second line segment.

In yet another embodiment of the present disclosure, a method for forming a semiconductor device structure is provided. The method includes forming a conductive pad in a semiconductor substrate, and forming a first mask layer over the semiconductor substrate and covering the conductive pad. The method also includes forming a second mask layer over the first mask layer, and performing an implantation process to introduce a doping species into the second mask layer. The method further includes forming an opening structure in the first mask layer and the second mask layer to expose the conductive pad after the implantation process is performed. The opening structure has a serpentine pattern in a top view. In addition, the method includes filling the opening structure with a conductive feature.

The embodiments of the present disclosure have some advantageous features. By performing an implantation process to introduce a doping species (e.g., carbon) into the mask layer surrounding the conductive feature, the stress of the mask layer may be reduced, which improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
a conductive pad disposed in a semiconductor substrate;
a first mask layer disposed over the semiconductor substrate;
a second mask layer disposed over the first mask layer, wherein the first mask layer and the second mask layer are made of different materials; and
a conductive feature penetrating through the first mask layer and the second mask layer to connect to the conductive pad, wherein the conductive feature has a serpentine pattern in a top view.

2. The semiconductor device structure of claim 1, wherein the second mask layer includes a diamond-like carbon material having sp3 bonding.

3. The semiconductor device structure of claim 1, wherein the second mask layer is doped with carbon.

4. The semiconductor device structure of claim 1, wherein the conductive feature further comprises:
a conductive layer; and
a barrier layer separating the conductive layer from the conductive pad, the first mask layer, the second mask layer.

5. The semiconductor device structure of claim 1, wherein the serpentine pattern of the conductive feature includes:
a first line segment and a second line segment extending along a first direction in a top view; and
a connecting segment extending along a second direction in the top view and physically connecting the first line segment and the second line segment, wherein the connecting segment has a width along the first direction, and a shortest distance between the first line segment and the second line segment is less than twice of the width of the connecting segment.

6. The semiconductor device structure of claim 5, wherein the first direction is perpendicular to the second direction, and an edge of the connecting segment is substantially aligned with an edge of the first line segment and an edge of the second line segment in the top view.

7. A semiconductor device structure, comprising:
a conductive pad disposed in a semiconductor substrate;
a first mask layer disposed over the semiconductor substrate;
a second mask layer disposed over the first mask layer; and
a conductive feature disposed in the first mask layer and the second mask layer and electrically connected to the conductive pad, wherein the conductive feature includes:
a connecting segment extending along a first direction; and
a first line segment and a second line segment extending along a second direction, wherein the first line segment and the second line segment are physically connected by the connecting segment, and an edge of the connecting segment is substantially aligned with an edge of the first line segment and an edge of the second line segment.

8. The semiconductor device structure of claim 7, wherein the first direction is perpendicular to the second direction.

9. The semiconductor device structure of claim 7, wherein the first direction and the second direction are parallel to a top surface of the conductive feature.

10. The semiconductor device structure of claim 7, wherein the connecting segment has a width along the second direction, and a shortest distance between the first line segment and the second line segment is less than twice of the width of the connecting segment.

11. The semiconductor device structure of claim 7, wherein the first mask layer includes silicon nitride or silicon oxynitride, the second mask layer includes a diamond-like carbon material having sp3 bonding, and the second mask layer is doped with carbon.

12. A method for forming a semiconductor device structure, comprising:
forming a conductive pad in a semiconductor substrate;
forming a first mask layer over the semiconductor substrate and covering the conductive pad;
forming a second mask layer over the first mask layer;
performing an implantation process to introduce a doping species into the second mask layer;
forming an opening structure in the first mask layer and the second mask layer to expose the conductive pad after the implantation process is performed, wherein the opening structure has a serpentine pattern in a top view; and
filling the opening structure with a conductive feature.

13. The method for forming a semiconductor device structure of claim 12, wherein the first mask layer and the second mask layer include different materials before the implantation process is performed.

14. The method for forming a semiconductor device structure of claim 12, wherein the second mask layer includes a diamond-like carbon material having sp3 bonding before the implantation process is performed.

15. The method for forming a semiconductor device structure of claim 12, wherein the doping species includes carbon.

16. The method for forming a semiconductor device structure of claim 12, wherein filling the opening structure with the conductive feature comprises:
   depositing a barrier layer lining the opening structure and extending over the second mask layer;
   forming a conductive layer in a remaining portion of the opening structure and over the barrier layer; and
   performing a planarization process on the barrier layer and the conductive layer until the second mask layer is exposed.

17. The method for forming a semiconductor device structure of claim 12, wherein the serpentine pattern of the opening structure includes:
   a first line segment and a second line segment extending parallel to each other; and
   a connecting segment physically connecting the first line segment and the second line segment, wherein an edge of the connecting segment is substantially aligned with an edge of the first line segment and an edge of the second line segment.

18. The method for forming a semiconductor device structure of claim 17, wherein an extending direction of the connecting segment is perpendicular to an extending direction of the first line segment, and
   wherein the connecting segment has a width along the extending direction of the first line segment, and a shortest distance between the first line segment and the second line segment is less than twice of the width of the connecting segment.

19. The method for forming a semiconductor device structure of claim 12, further comprising:
   forming a dielectric anti-reflective coating (DARC) layer over the second mask layer; and
   forming a patterned mask over the DARC layer, wherein the opening structure is formed by performing an etching process using the patterned mask as a mask, and the patterned mask and the DARC layer are removed before the conductive feature is formed.

20. The method for forming a semiconductor device structure of claim 19, wherein the implantation process is performed after the DARC layer is formed.

* * * * *